United States Patent
Cady et al.

(10) Patent No.: US 7,026,708 B2
(45) Date of Patent: Apr. 11, 2006

(54) LOW PROFILE CHIP SCALE STACKING SYSTEM AND METHOD

(75) Inventors: James W. Cady, Austin, TX (US); Julian Partridge, Austin, TX (US); James Douglas Wehrly, Jr., Austin, TX (US); James Wilder, Austin, TX (US); David L. Roper, Austin, TX (US); Jeff Buchle, Austin, TX (US)

(73) Assignee: Staktek Group L.P., Austin, TX (US)

( * ) Notice: Subject to any disclaimer, the term of this patent is extended or adjusted under 35 U.S.C. 154(b) by 389 days.

(21) Appl. No.: 10/631,886

(22) Filed: Jul. 11, 2003

(65) Prior Publication Data

US 2004/0052060 A1    Mar. 18, 2004

Related U.S. Application Data

(63) Continuation-in-part of application No. 10/457,608, filed on Jun. 9, 2003, which is a continuation-in-part of application No. 10/453,398, filed on Jun. 3, 2003, now Pat. No. 6,914,324, which is a continuation-in-part of application No. 10/005,581, filed on Oct. 26, 2001, now Pat. No. 6,576,992.

(51) Int. Cl.
*H01L 23/488* (2006.01)
*H05K 1/14* (2006.01)

(52) U.S. Cl. ............... 257/686; 257/737; 257/738; 257/777; 257/778; 361/749; 361/803; 438/108; 438/109; 438/125; 438/613; 29/830; 29/840

(58) Field of Classification Search ............ None
See application file for complete search history.

(56) References Cited

U.S. PATENT DOCUMENTS

| | | | |
|---|---|---|---|
| 3,411,122 A | 11/1968 | Schiller et al. | |
| 3,436,604 A | 4/1969 | Hyltin | 317/101 |
| 3,654,394 A | 4/1972 | Gordon | 179/15 BL |
| 3,727,064 A | 4/1973 | Bottini | 250/217 |
| 3,746,934 A | 7/1973 | Stein | 317/101 |
| 3,766,439 A | 10/1973 | Isaacson | |
| 3,772,776 A | 11/1973 | Weisenburger | 29/628 |
| 3,983,547 A | 9/1976 | Almasi | |

(Continued)

FOREIGN PATENT DOCUMENTS

DE    004215467 A1    11/1992

(Continued)

OTHER PUBLICATIONS

Tessera uZ Ball Stack Package. 4 figures that purport to be directed to the uZ—Ball Stacked Memory, Published on the Internet.

(Continued)

*Primary Examiner*—John B. Vigushin
(74) *Attorney, Agent, or Firm*—Andrews Kurth LLP; J. Scott Denko (57) ABSTRACT

The present invention stacks chip scale-packaged integrated circuits (CSPs) into low profile modules that conserve PWB or other board surface area. Low profile contacts are created by any of a variety of methods and materials. A consolidated low profile contact structure and technique is provided for use in alternative embodiments of the present invention. Multiple numbers of CSPs may be stacked in accordance with the present invention. The CSPs employed in stacked modules devised in accordance with the present invention are connected with flex circuitry that exhibit one or two or more conductive layers.

25 Claims, 7 Drawing Sheets

U.S. PATENT DOCUMENTS

| | | |
|---|---|---|
| 4,079,511 A | 3/1978 | Grabbe |
| 4,103,318 A | 7/1978 | Schwede .................... 361/388 |
| 4,288,841 A | 9/1981 | Gogal ........................ 361/414 |
| 4,398,235 A | 8/1983 | Lutz et al. .................. 361/393 |
| 4,406,508 A | 9/1983 | Sadigh-Behzadi ........... 339/75 |
| 4,437,235 A | 3/1984 | McIver ........................ 29/840 |
| 4,513,368 A | 4/1985 | Houseman ................. 364/200 |
| 4,587,596 A | 5/1986 | Bunnell |
| 4,645,944 A | 2/1987 | Uya ............................ 307/243 |
| 4,696,525 A | 9/1987 | Coller et al. .................. 439/69 |
| 4,712,129 A | 12/1987 | Orcutt |
| 4,722,691 A | 2/1988 | Gladd et al. |
| 4,733,461 A | 3/1988 | Nakano ....................... 29/830 |
| 4,758,875 A | 7/1988 | Fujisawa et al. |
| 4,763,188 A | 8/1988 | Johnson ..................... 257/777 |
| 4,821,007 A | 4/1989 | Fields et al. ................ 333/238 |
| 4,823,234 A | 4/1989 | Konishi et al. ............. 361/386 |
| 4,833,568 A | 5/1989 | Berhold ..................... 361/383 |
| 4,839,717 A | 6/1989 | Phy et al. |
| 4,862,249 A | 8/1989 | Carlson ........................ 357/80 |
| 4,884,237 A | 11/1989 | Mueller et al. .............. 365/63 |
| 4,891,789 A | 1/1990 | Quattrini et al. ............. 365/63 |
| 4,911,643 A | 3/1990 | Perry et al. .................. 439/67 |
| 4,953,060 A | 8/1990 | Lauffer et al. .............. 361/388 |
| 4,956,694 A | 9/1990 | Eide ............................ 357/74 |
| 4,983,533 A | 1/1991 | Go ................................ 437/7 |
| 4,985,703 A | 1/1991 | Kaneyama .................. 341/141 |
| 5,012,323 A | 4/1991 | Farnworth ..................... 357/75 |
| 5,016,138 A | 5/1991 | Woodman .................. 361/381 |
| 5,034,350 A | 7/1991 | Marchisi ..................... 437/207 |
| 5,041,015 A | 8/1991 | Travis ........................ 439/492 |
| 5,041,902 A | 8/1991 | McShane |
| 5,057,903 A | 10/1991 | Olla |
| 5,064,782 A | 11/1991 | Nishiguchi |
| 5,068,708 A | 11/1991 | Newman |
| 5,081,067 A | 1/1992 | Shimizu et al. |
| 5,099,393 A | 3/1992 | Bentlage et al. ............ 361/413 |
| 5,104,820 A | 4/1992 | Go et al. ...................... 437/51 |
| 5,117,282 A | 5/1992 | Salatino |
| 5,122,862 A | 6/1992 | Kajihara et al. |
| 5,138,430 A | 8/1992 | Gow, 3rd et al. ............. 357/70 |
| 5,138,434 A | 8/1992 | Wood et al. |
| 5,158,912 A | 10/1992 | Kellerman et al. |
| 5,159,434 A | 10/1992 | Kohno et al. .................. 357/80 |
| 5,159,535 A | 10/1992 | Desai et al. |
| 5,168,926 A | 12/1992 | Watson et al. |
| 5,198,888 A | 3/1993 | Sugano et al. .............. 257/686 |
| 5,198,965 A | 3/1993 | Curtis et al. |
| 5,214,307 A | 5/1993 | Davis |
| 5,219,794 A | 6/1993 | Satoh et al. |
| 5,222,014 A | 6/1993 | Lin ............................ 361/414 |
| 5,224,023 A | 6/1993 | Smith et al. ................ 361/412 |
| 5,229,916 A | 7/1993 | Frankeny et al. |
| 5,239,198 A | 8/1993 | Lin et al. .................... 257/693 |
| 5,240,588 A | 8/1993 | Uchida |
| 5,241,454 A | 8/1993 | Ameen et al. .............. 361/744 |
| 5,243,133 A | 9/1993 | Engle et al. |
| 5,247,423 A | 9/1993 | Lin et al. .................... 361/719 |
| 5,252,855 A | 10/1993 | Ogawa et al. |
| 5,252,857 A | 10/1993 | Kane et al. |
| 5,259,770 A | 11/1993 | Bates et al. .................. 439/66 |
| 5,261,068 A | 11/1993 | Gaskins et al. ............. 395/425 |
| 5,262,927 A | 11/1993 | Chia et al. .................. 361/784 |
| 5,276,418 A | 1/1994 | Klosowiak et al. |
| 5,279,029 A | 1/1994 | Burns .......................... 29/856 |
| 5,281,852 A | 1/1994 | Normington ................ 257/685 |
| 5,289,062 A | 2/1994 | Wyland ....................... 307/577 |
| 5,311,401 A | 5/1994 | Gates, Jr. et al. ........... 361/760 |
| 5,313,097 A | 5/1994 | Haj-Ali-Ahmadi et al. . 257/706 |
| 5,343,075 A | 8/1994 | Nishino ...................... 257/686 |
| 5,347,428 A | 9/1994 | Carson et al. .............. 361/760 |
| 5,357,478 A | 10/1994 | Kikuda et al. |
| 5,361,228 A | 11/1994 | Adachi et al. |
| 5,375,041 A | 12/1994 | McMahon .................. 361/749 |
| 5,377,077 A | 12/1994 | Burns ......................... 361/704 |
| 5,386,341 A | 1/1995 | Olson et al. |
| 5,394,010 A | 2/1995 | Tazawa et al. .............. 257/686 |
| 5,394,303 A | 2/1995 | Yamaji |
| 5,397,916 A | 3/1995 | Normington |
| 5,402,006 A | 3/1995 | O'Donley ................... 257/796 |
| 5,420,751 A | 5/1995 | Burns ......................... 361/707 |
| 5,428,190 A | 6/1995 | Stopperan .................. 174/261 |
| 5,438,224 A | 8/1995 | Papageorge et al. |
| 5,446,620 A | 8/1995 | Burns et al. ................ 361/704 |
| 5,448,511 A | 9/1995 | Paurus et al. |
| 5,455,740 A | 10/1995 | Burns ......................... 361/735 |
| 5,475,920 A | 12/1995 | Burns et al. .................. 29/856 |
| 5,477,082 A | 12/1995 | Buckley, III et al. |
| 5,479,318 A | 12/1995 | Burns ......................... 361/735 |
| 5,484,959 A | 1/1996 | Burns ......................... 174/524 |
| 5,493,476 A | 2/1996 | Burns ......................... 361/735 |
| 5,499,160 A | 3/1996 | Burns ......................... 361/704 |
| 5,502,333 A | 3/1996 | Bertin et al. |
| 5,514,907 A | 5/1996 | Moshayedi ................. 257/723 |
| 5,523,619 A | 6/1996 | McAllister et al. ......... 257/686 |
| 5,523,695 A | 6/1996 | Lin |
| 5,541,812 A | 7/1996 | Burns ......................... 361/735 |
| 5,543,664 A | 8/1996 | Burns ......................... 257/787 |
| 5,572,065 A | 11/1996 | Burns ......................... 257/666 |
| 5,588,205 A | 12/1996 | Roane |
| 5,592,364 A | 1/1997 | Roane ......................... 361/735 |
| 5,594,275 A | 1/1997 | Kwon et al. |
| 5,612,570 A | 3/1997 | Eide et al. .................. 257/686 |
| 5,631,193 A | 5/1997 | Burns ........................... 29/827 |
| 5,642,055 A | 6/1997 | Difrancesco |
| 5,644,161 A | 7/1997 | Burns ......................... 257/668 |
| 5,646,446 A | 7/1997 | Nicewarner, Jr. et al. |
| 5,654,877 A | 8/1997 | Burns ......................... 361/713 |
| 5,657,537 A | 8/1997 | Saia et al. |
| 5,677,569 A | 10/1997 | Choi et al. |
| 5,729,894 A | 3/1998 | Rostoker et al. |
| 5,744,827 A | 4/1998 | Jeong et al. |
| 5,751,553 A | 5/1998 | Clayton |
| 5,763,296 A | 6/1998 | Casati et al. |
| 5,764,497 A | 6/1998 | Mizumo et al. |
| 5,776,797 A | 7/1998 | Nicewarner, Jr. et al. ... 438/107 |
| 5,778,522 A | 7/1998 | Burns |
| 5,783,464 A | 7/1998 | Burns |
| 5,789,815 A | 8/1998 | Tessier et al. |
| 5,801,437 A | 9/1998 | Burns ......................... 257/685 |
| 5,801,439 A | 9/1998 | Fujisawa et al. |
| 5,804,870 A | 9/1998 | Burns |
| 5,805,422 A | 9/1998 | Otake et al. ................. 361/749 |
| 5,835,988 A | 11/1998 | Ishii .......................... 257/684 |
| 5,841,721 A | 11/1998 | Kwon et al. |
| 5,869,353 A | 2/1999 | Levy et al. .................. 438/109 |
| 5,895,970 A | 4/1999 | Miyoshi et al. |
| 5,899,705 A | 5/1999 | Akram |
| 5,917,709 A | 6/1999 | Johnson et al. |
| 5,922,061 A | 7/1999 | Robinson |
| 5,925,934 A | 7/1999 | Lim |
| 5,926,369 A | 7/1999 | Ingraham et al. ........... 361/699 |
| 5,949,657 A | 9/1999 | Karabatsos ................. 361/803 |
| 5,953,215 A | 9/1999 | Karabatsos ................. 361/767 |
| 5,959,839 A | 9/1999 | Gates |
| 5,963,427 A | 10/1999 | Bolleson |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,014,316 A | 1/2000 | Eide .......................... 361/735 |
| 6,028,352 A | 2/2000 | Eide .......................... 257/686 |
| 6,028,365 A | 2/2000 | Akram et al. ............... 257/778 |
| 6,034,878 A | 3/2000 | Osaka et al. |

| | | |
|---|---|---|
| 6,040,624 A | 3/2000 | Chambers et al. |
| 6,072,233 A | 6/2000 | Corisis et al. ............... 257/686 |
| 6,084,293 A | 7/2000 | Ohuchi |
| 6,084,294 A | 7/2000 | Tomita |
| 6,097,087 A | 8/2000 | Farnworth et al. .......... 257/698 |
| 6,121,676 A | 9/2000 | Solberg |
| RE36,916 E | 10/2000 | Moshayedi ................. 257/723 |
| 6,157,541 A | 12/2000 | Hacke |
| 6,165,817 A | 12/2000 | Akram |
| 6,172,874 B1 | 1/2001 | Bartilson ..................... 361/719 |
| 6,178,093 B1 | 1/2001 | Bhatt et al. |
| 6,187,652 B1 | 2/2001 | Chou et al. |
| 6,205,654 B1 | 3/2001 | Burns .......................... 29/830 |
| 6,208,521 B1 | 3/2001 | Nakatsuka .................. 361/749 |
| 6,222,737 B1 | 4/2001 | Ross |
| 6,225,688 B1 | 5/2001 | Kim et al. ................... 257/686 |
| 6,233,650 B1 | 5/2001 | Johnson et al. ................. 711/5 |
| 6,234,820 B1 | 5/2001 | Perino et al. |
| 6,262,895 B1 | 7/2001 | Forthun ....................... 361/749 |
| 6,265,660 B1 | 7/2001 | Tandy ........................ 174/52.4 |
| 6,266,252 B1 | 7/2001 | Karabatsos .................. 361/788 |
| 6,281,577 B1 | 8/2001 | Oppermann et al. ........ 257/724 |
| 6,285,560 B1 | 9/2001 | Lyne |
| 6,288,907 B1 | 9/2001 | Burns |
| 6,300,679 B1 | 10/2001 | Mukerji et al. .............. 257/738 |
| 6,303,981 B1 | 10/2001 | Moden |
| 6,310,392 B1 | 10/2001 | Burns |
| 6,313,998 B1 | 11/2001 | Kledzik |
| 6,316,825 B1 | 11/2001 | Park et al. |
| 6,323,060 B1 | 11/2001 | Isaak .......................... 438/109 |
| 6,329,708 B1 | 12/2001 | Komiyama |
| 6,336,262 B1 | 1/2002 | Dalal et al. |
| 6,351,029 B1 | 2/2002 | Isaak .......................... 257/688 |
| 6,360,433 B1 | 3/2002 | Ross |
| 6,368,896 B1 | 4/2002 | Farnworth et al. .......... 438/113 |
| 6,376,769 B1 | 4/2002 | Chung |
| 6,392,162 B1 | 5/2002 | Karabatsos .................. 174/261 |
| 6,410,857 B1 | 6/2002 | Gonya ........................ 174/254 |
| 6,426,240 B1 | 7/2002 | Isaak .......................... 438/106 |
| 6,426,549 B1 | 7/2002 | Isaak .......................... 257/686 |
| 6,426,560 B1 | 7/2002 | Kawamura et al. |
| 6,433,418 B1 | 8/2002 | Fujisawa et al. ............ 257/696 |
| 6,444,490 B1 | 9/2002 | Bertin et al. |
| 6,444,921 B1 | 9/2002 | Wang et al. ................. 174/260 |
| 6,446,158 B1 | 9/2002 | Karabatsos ..................... 711/5 |
| 6,449,159 B1 | 9/2002 | Haba |
| 6,452,826 B1 | 9/2002 | Kim et al. |
| 6,462,412 B1 | 10/2002 | Kamei et al. ............... 257/723 |
| 6,465,877 B1 | 10/2002 | Farnworth et al. .......... 257/668 |
| 6,465,893 B1 | 10/2002 | Khandros et al. ........... 257/777 |
| 6,473,308 B1 | 10/2002 | Forthun ....................... 361/749 |
| 6,486,544 B1 | 11/2002 | Hashimoto .................. 257/686 |
| 6,489,178 B1 | 12/2002 | Coyle et al. |
| 6,489,687 B1 | 12/2002 | Hashimoto |
| 6,492,718 B1 | 12/2002 | Ohmori |
| 6,509,639 B1 | 1/2003 | Lin |
| 6,514,793 B1 | 2/2003 | Isaak .......................... 438/109 |
| 6,528,870 B1 | 3/2003 | Fukatsu et al. |
| 6,552,910 B1 | 4/2003 | Moon et al. |
| 6,560,117 B1 | 5/2003 | Moon .......................... 361/749 |
| 6,572,387 B1 | 6/2003 | Burns et al. ................... 439/69 |
| 6,576,992 B1 | 6/2003 | Cady et al. |
| 6,588,095 B1 | 7/2003 | Pan |
| 6,590,282 B1 | 7/2003 | Wang et al. ................. 257/686 |
| 6,600,222 B1 | 7/2003 | Levardo ...................... 257/686 |
| 6,614,664 B1 | 9/2003 | Lee |
| 6,620,651 B1 | 9/2003 | He et al. ..................... 438/113 |
| 6,627,984 B1 | 9/2003 | Bruce et al. ................. 257/686 |
| 6,657,134 B1 | 12/2003 | Spielberger et al. |
| 6,660,561 B1 | 12/2003 | Forthun |
| 6,677,670 B1 | 1/2004 | Kondo |
| 6,683,377 B1 | 1/2004 | Shim et al. |
| 6,690,584 B1 | 2/2004 | Uzuka et al. |
| 6,699,730 B1 | 3/2004 | Kim et al. |
| 6,707,684 B1 | 3/2004 | Andric et al. |
| 6,709,893 B1 | 3/2004 | Moden et al. |
| 6,765,288 B1* | 7/2004 | Damberg .................... 257/698 |
| 6,768,660 B1 | 7/2004 | Kong et al. |
| 6,781,240 B1 | 8/2004 | Choi et al. |
| 6,803,651 B1 | 10/2004 | Chiang |
| 6,812,567 B1 | 11/2004 | Kim et al. |
| 6,833,984 B1 | 12/2004 | Belgacem |
| 6,849,949 B1 | 2/2005 | Lyu et al. |
| 6,876,074 B1 | 4/2005 | Kim |
| 6,884,653 B1 | 4/2005 | Larson |
| 6,891,729 B1 | 5/2005 | Ko et al. |
| 6,908,792 B1 | 6/2005 | Bruce et al. |
| 6,914,324 B1 | 7/2005 | Rapport et al. |
| 6,919,626 B1 | 7/2005 | Burns |
| 2001/0006252 A1 | 7/2001 | Kim et al. |
| 2001/0013423 A1 | 8/2001 | Dalal et al. |
| 2001/0015487 A1 | 8/2001 | Forthun |
| 2001/0035572 A1 | 11/2001 | Isaak |
| 2001/0040793 A1 | 11/2001 | Inaba |
| 2002/0006032 A1 | 1/2002 | Karabatsos ................. 361/760 |
| 2002/0030995 A1 | 3/2002 | Shoji |
| 2002/0048849 A1 | 4/2002 | Isaak |
| 2002/0076919 A1 | 6/2002 | Peters et al. |
| 2002/0101261 A1 | 8/2002 | Karabatsos .................. 326/83 |
| 2002/0139577 A1 | 10/2002 | Miller ......................... 174/261 |
| 2002/0164838 A1 | 11/2002 | Moon et al. ................. 438/107 |
| 2002/0180022 A1 | 12/2002 | Emoto ........................ 257/686 |
| 2003/0016710 A1 | 1/2003 | Kamoto |
| 2003/0045025 A1 | 3/2003 | Coyle et al. |
| 2003/0049886 A1 | 3/2003 | Salmon |
| 2003/0081392 A1 | 5/2003 | Cady et al. |
| 2003/0107118 A1 | 6/2003 | Pflughaupt et al. |
| 2003/0109078 A1 | 6/2003 | Takahashi et al. |
| 2003/0168725 A1 | 9/2003 | Warner et al. |
| 2004/0000708 A1 | 1/2004 | Rapport et al. |
| 2004/0021211 A1 | 2/2004 | Damberg |
| 2004/0031972 A1 | 2/2004 | Pflughaupt et al. |
| 2004/0045159 A1 | 3/2004 | DiStefano et al. |
| 2004/0065963 A1 | 4/2004 | Karnezos |
| 2004/0075991 A1 | 4/2004 | Haba |
| 2004/0099938 A1 | 5/2004 | Kang et al. |
| 2004/0104470 A1 | 6/2004 | Bang et al. |
| 2004/0115866 A1 | 6/2004 | Bang et al. |
| 2004/0150107 A1 | 8/2004 | Cha et al. |
| 2004/0157352 A1 | 8/2004 | Beroz et al. |
| 2004/0203190 A1 | 10/2004 | Pflughaupt et al. |
| 2004/0217461 A1 | 11/2004 | Damberg |
| 2004/0217471 A1 | 11/2004 | Haba |
| 2004/0238931 A1 | 12/2004 | Haba et al. |
| 2004/0245617 A1 | 12/2004 | Damberg et al. |
| 2005/0018495 A1 | 1/2005 | Bhakta et al. |
| 2005/0035440 A1 | 2/2005 | Mohammed |
| 2005/0040508 A1 | 2/2005 | Lee |
| 2005/0133897 A1 | 6/2005 | Baek et al. |

FOREIGN PATENT DOCUMENTS

| | | |
|---|---|---|
| DE | 004214102 A1 | 12/1992 |
| EP | 122-687 A | 10/1984 |
| EP | 0 298 211 A | 1/1989 |
| EP | 0426-303 (A2) | 10/1990 |
| EP | 461-639 A | 12/1991 |
| JP | 57-31166(A) | 2/1982 |
| JP | 58-96756(A) | 6/1983 |
| JP | 58-112348(A) | 7/1983 |
| JP | 59088863 (A) | 5/1984 |
| JP | 60-254762 | 12/1985 |
| JP | 60-254762 (A) | 12/1985 |
| JP | 1047659 (A) | 3/1986 |
| JP | 62-230027(A) | 8/1987 |
| JP | 62-230027(A) | 10/1987 |

| | | |
|---|---|---|
| JP | 63-153849(A) | 6/1988 |
| JP | 4-209562 (A) | 7/1992 |
| JP | 04368167 (A) | 12/1992 |
| JP | 5-21697(A) | 1/1993 |
| JP | 5029534 (A) | 2/1993 |
| JP | 63-153849 (A) | 6/1998 |
| JP | 2000/307029 (A) | 11/2000 |
| JP | 2001077294(A) | 3/2001 |
| JP | 2001085592(A) | 3/2001 |
| JP | 2001332683(A) | 11/2001 |
| JP | 2003037246(A) | 2/2003 |
| JP | 2003086760(A) | 3/2003 |
| JP | 2003086761(A) | 3/2003 |
| JP | 2003/309247 (A) | 10/2003 |
| JP | 2003309246(A) | 10/2003 |
| JP | 2003/347475 (A) | 12/2003 |
| JP | 2003/347503 (A) | 12/2003 |
| SU | 834-957 | 5/1981 |
| WO | WO 03/037053 A1 | 5/2003 |

OTHER PUBLICATIONS

Ron Bauer, Intel. "Stacked-CSP Delivers Flexibility, Reliability, and Space-Saving Capabilities", vol. 3, Spring 2002. Published on the Internet.

1992 Proceedings, 42nd Electronic Components & Technology Conference, May 18-20, 1992.

Research Disclosure, Organic Card Device Carrier, 31318, May 1990, No. 313.

IBM Technical Disclosure Bulletin, vol. 23, No. 12, May 1981.

IBM Technical Disclosure Bulletin, vol. 20, No. 11A, Apr. 1978.

IBM Technical Disclosure Bulletin, vol. 32, No. 3B, Aug. 1989.

Orthogonal Chip Mount—A 3D Hybrid Wafer Scale Integration Technology, International Electron Device Meeting, IEDM Technical Digest, Washington, D.C., Dec. 6-9, 1987.

Dense-Pac Microsystems, 16 Megabit High Speed CMOS SRAM DPS1MX16MKn3.

Dense-Pac Microsystems, 256 Megabyte CMOS DRAM DP3ED32MS72RW5.

Dense-Pac Microsystems, Breaking Space Barriers, 3-D Technology 1993.

Dense-Pac Microsystems, DPS512X16A3, Ceramic 512K×16 CMOS SRAM Module.

"Design Techniques for Ball Grid Arrays," William R. Newberry, Xynetix Design Systems, Inc.

"Chip Scale Packaging and Redistribution," Paul A. Magill, Glenn A. Rinne, J. Daniel Mis, Wayne C. Machon, Joseph W. Baggs, Unitive Electronics Inc.

"Alterable Interposer Block for Personalizing Stacked Module Interconnections," *IBM Technical Disclosure Bulletin*, vol. 30, No. 8, Jan. 8, 1988, pp. 373-374.

IBM Preliminary 168 Pin SDRAM Registered DIMM Functional Description & Timing Diagrams.

"3D Interconnection for Ultra-Dense Multichip Modules," Christian VAL, Thomson-CSF DCS Computer Division, Thierry Lemoine, Thomson-CSF RCM Radar Countermeasures Division.

"High Density Memory Packaging Technology High Speed Imaging Applications," Dean Frew, Texas Instruments Incorporated.

Teresa Technologies, Inc.—Semiconductor Intellectual Property, Chip Scale Packaging-Website pp. (3).

"Tessera Introduces uZ™—Ball Stacked Memory Package for Computing and Portable Electronic Products" Joyce Smaragdis, Tessera Public Relations; 2 figures that purport to be directed to the uZ™—Ball Stacked Memory Package.

Ron Bauer, Intel. "Stacked-CSP Delivers Flexibility, Reliability, and Space-Saving Capabilities", Spring 2002.

Tessera uZ Ball Stack Package. 4 figures that purport to be directed to the uZ—Ball Stacked Memory, 1 Page.

"Vertically-Intergrated Package," Alvin Weinberg, Pacesetter, Inc. and W. Kinzy Jones, Florida International University.

Chip Scale Review Online—An Independent Journal Dedicated to the Advancement of Chip-Scale Electronics. (Website 9 pages) Fjelstad, Joseph, Pacific Consultants L.L.C.

Flexible Thinking: Examining the Flexible Circuit Tapes. (Website 2 pages) Fjelstad, Joseph.

Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002.

Flexible Printied Circuit Technology—A Versatile Interconnection Option. (Website 2 pages) Fjelstad, Joseph. Dec. 3, 2002.

\* cited by examiner

LOW PROFILE CHIP SCALE STACKING SYSTEM AND METHOD

RELATED APPLICATIONS

This application is a continuation-in-part of U.S. patent application Ser. No. 10/453,398, filed Jun. 3, 2003 now U.S. Pat. No. 6,914,324, which is a continuation-in-part of U.S. patent application Ser. No. 10/005,581, filed Oct. 26, 2001, now U.S. Pat. No. 6,576,992 B2, issued Jun. 10, 2003, both of which applications are hereby incorporated by reference in their entirety, and this application is a continuation-in-part of U.S. patent application Ser. No. 10/457,608 filed Jun. 9, 2003, pending, which is incorporated by reference in its entirety and which application is a continuation-in-part of U.S. patent application Ser. No. 10/005,581, filed Oct. 26, 2001, now U.S. patent application Ser. No. 6,576,992 B2.

TECHNICAL FIELD

The present invention relates to aggregating integrated circuits and, in particular, to stacking integrated circuits in chip-scale packages.

BACKGROUND OF THE INVENTION

A variety of techniques are used to stack packaged integrated circuits. Some methods require special packages, while other techniques stack conventional packages. In some stacks, the leads of the packaged integrated circuits are used to create a stack, while in other systems, added structures such as rails provide all or part of the interconnection between packages. In still other techniques, flexible conductors with certain characteristics are used to selectively interconnect packaged integrated circuits.

The predominant package configuration employed during the past decade has encapsulated an integrated circuit (IC) in a plastic surround typically having a rectangular configuration. The enveloped integrated circuit is connected to the application environment through leads emergent from the edge periphery of the plastic encapsulation. Such "leaded packages" have been the constituent elements most commonly employed by techniques for stacking packaged integrated circuits.

Leaded packages play an important role in electronics, but efforts to miniaturize electronic components and assemblies have driven development of technologies that preserve circuit board surface area. Because leaded packages have leads emergent from peripheral sides of the package, leaded packages occupy more than a minimal amount of circuit board surface area. Consequently, alternatives to leaded packages known as chip scale packaging or "CSP" have recently gained market share.

CSP refers generally to packages that provide connection to an integrated circuit through a set of contacts arrayed across a major surface of the package. Instead of leads emergent from a peripheral side of the package, contacts are placed on a major surface and typically are located along the planar bottom surface of the package. The absence of "leads" on package sides renders most stacking techniques devised for leaded packages inapplicable for CSP stacking.

What is needed, therefore, is a technique and system for stacking CSPs that provides a thermally efficient, reliable structure that performs well at higher frequencies but does not add excessive height to the stack yet allows production at reasonable cost with readily understood and managed materials and methods.

SUMMARY OF THE INVENTION

The present invention stacks chip scale-packaged integrated circuits (CSPs) into low profile modules that conserve PWB or other board surface area. Although the present invention is applied most frequently to CSPs that contain one die, it may be employed with CSPs that include more than one integrated circuit die.

Preferred embodiments employ low profile contact structures to provide connection between CSPs of the stacked module and between and to the flex circuitry. Low profile contacts are created by any of a variety of methods and materials including, for example, screen paste techniques and use of high temperature solders, although other application techniques and traditional solders may be employed for creating low profile contacts that may be employed in the present invention. A consolidated low profile contact structure and technique is provided for use in alternative embodiments of the present invention.

Multiple numbers of CSPs may be stacked in accordance with the present invention. The CSPs employed in stacked modules devised in accordance with the present invention are connected with flex circuitry. That flex circuitry may exhibit one or two or more conductive layers with preferred embodiments having two conductive layers.

In some preferred embodiments, a form standard provides a physical form that allows many of the varying package sizes found in the broad family of CSP packages to be used to advantage while employing a standard connective flex circuitry design. In other embodiments, a heat spreader is disposed between the CSP and the flex circuitry thus providing an improved heat transference function without the standardization of the form standard, while still other embodiments lack either a form standard or a heat spreader and may employ, for example, the flex circuitry as a heat transference material.

DESCRIPTION OF THE PREFERRED EMBODIMENTS

Figure 1:
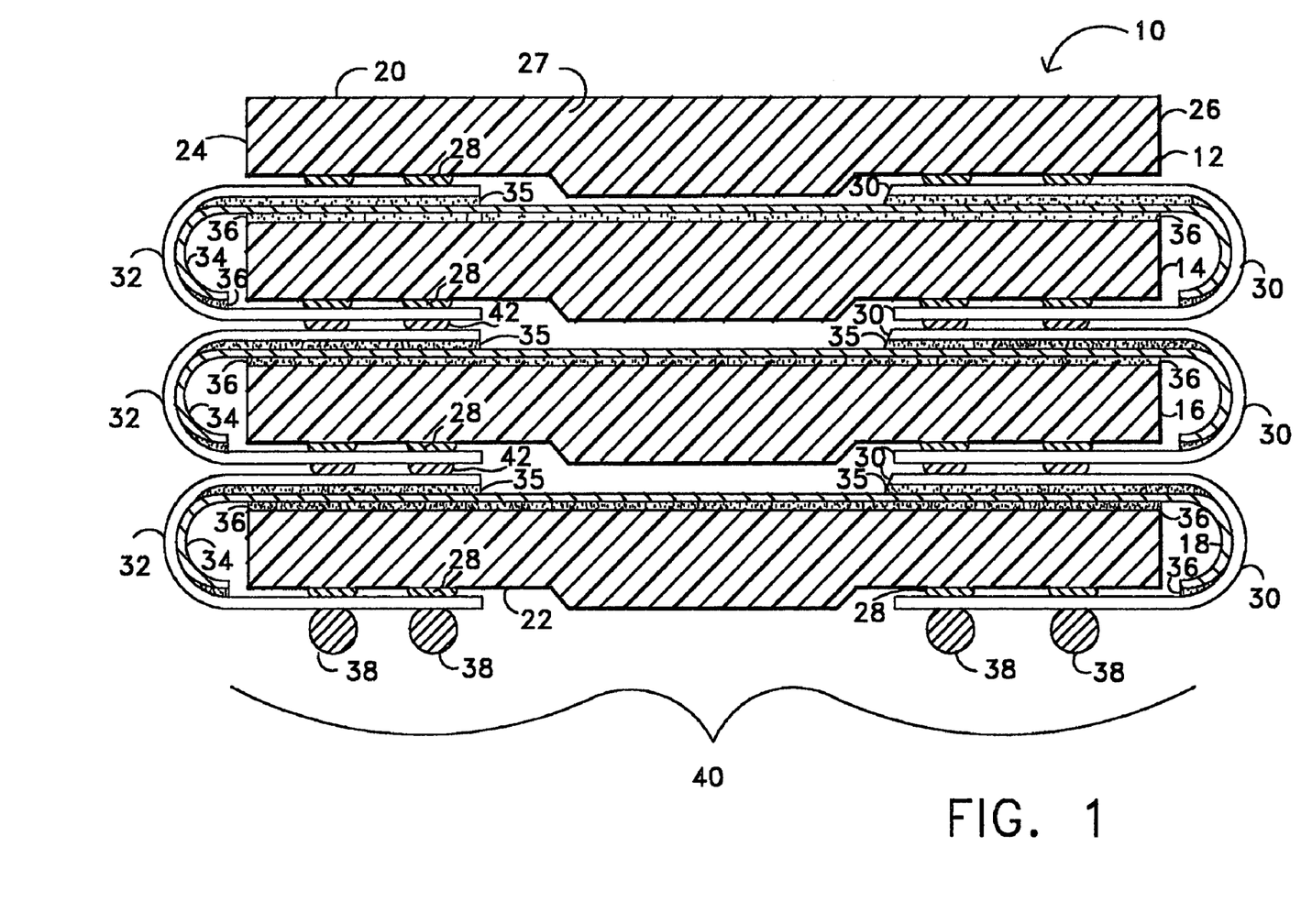
FIG. 1 is an elevation view of a high-density circuit module devised in accordance with a preferred four-high embodiment of the present invention.

FIG. 1 is an elevation view of module 10 devised in accordance with a preferred embodiment of the present invention. Exemplar module 10 is comprised of four CSPs: level four CSP 12, level three CSP 14, level two CSP 16, and level one CSP 18. Each of the depicted CSPs has an upper surface 20 and a lower surface 22 and opposite lateral sides or edges 24 and 26 and include at least one integrated circuit surrounded by a body 27.

Figure 2:
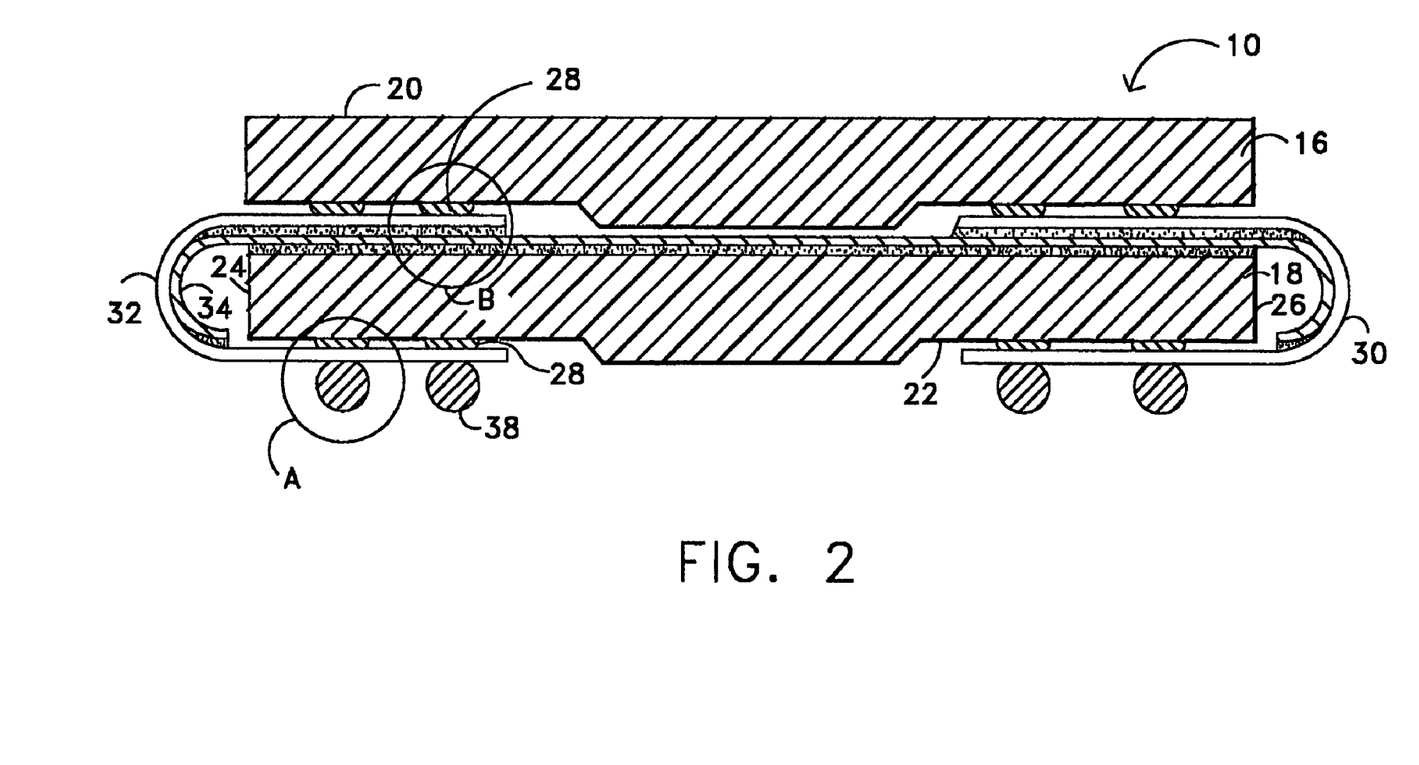
FIG. 2 is an elevation view of a stacked high-density circuit module devised in accordance with a preferred two-high embodiment of the present invention.

The invention is used with CSP packages of a variety of types and configurations such as, for example, those that are die-sized, as well those that are near chip-scale as well as the variety of ball grid array packages known in the art. It may also be used with those CSP-like packages that exhibit bare die connectives on one major surface. Thus, the term CSP should be broadly considered in the context of this application. The invention may be employed to advantage in the wide range of CSP configurations available in the art where an array of connective elements is available from at least one major surface. Collectively, these will be known herein as chip scale packaged integrated circuits (CSPs) and preferred embodiments will be described in terms of CSPs, but the particular configurations used in the explanatory figures are not, however, to be construed as limiting. For example, the elevation views of FIGS. 1 and 2 are depicted with CSPs of a particular profile known to those in the art, but it should be understood that the figures are exemplary only. For example, in FIG. 7, a CSP is shown that has a profile different than the profile of the CSPs shown in FIGS. 1 and 2. The invention is advantageously employed with CSPs that contain memory circuits, but may be employed to advantage with logic and computing circuits where added capacity without commensurate PWB or other board surface area consumption is desired.

Shown in FIG. 1 are low profile contacts 28 along lower surfaces 22 of the illustrated constituent CSPs 12, 14, 16, and 18. Low profile contacts 28 provide connection to the integrated circuit or circuits within the respective packages.

CSPs often exhibit an array of balls along lower surface 22. Such ball contacts are typically solder ball-like structures appended to contact pads arrayed along lower surface 22. In many preferred embodiments of the present invention, CSPs that exhibit balls along lower surface 22 are processed to strip the balls from lower surface 22 or, alternatively, CSPs that do not have ball contacts or other contacts of appreciable height are employed. Only as a further example of the variety of contacts that may be employed in alternative preferred embodiments of the present invention, an embodiment is later disclosed in FIG. 4 and the accompanying text that is constructed using a CSP that exhibits ball contacts along lower surface 22. The ball contacts are then reflowed to create what will be called a consolidated contact.

Embodiments of the invention may also be devised that employ both standard ball contacts and low profile contacts or consolidated contacts. For example, in the place of low profile inter-flex contacts 42 or, in the place of low profile contacts 28, or in various combinations of those structures, standard ball contacts may be employed at some levels of module 10, while low profile contacts and/or low profile inter-flex contacts or consolidated contacts are used at other levels.

A typical eutectic ball found on a typical CSP memory device is approximately 15 mils in height. After solder reflow, such a ball contact will typically have a height of about 10 mils. In preferred modes of the present invention, low profile contacts 28 and/or low profile inter-flex contacts 42 have a height of approximately 7 mils or less and, more preferably, less than 5 mils.

Where present, the contact sites of a CSP that are typically found under or within the ball contacts typically provided on a CSP, participate in the creation of low profile contacts 28. One set of methods by which high-temperature types of low profile contacts 28 suitable for use in embodiments of the present invention are created is disclosed in co-pending and incorporated U.S. patent application Ser. No. 10/457,608 filed Jun. 9, 2003. In other embodiments, more typical solders, in paste form for example, may be applied either to the exposed contact sites or pads along lower surface 22 of a CSP and/or to the appropriate flex contact sites of the designated flex circuit to be employed with that CSP.

In FIG. 1, iterations of flex circuits ("flex", "flex circuits," "flexible circuit structures," "flexible circuitry") 30 and 32 are shown connecting various constituent CSPs. Any flexible or conformable substrate with an internal layer connectivity capability may be used as a preferable flex circuit in the invention. The entire flex circuit may be flexible or, as those of skill in the art will recognize, a PCB structure made flexible in certain areas to allow conformability around CSPs and rigid in other areas for planarity along CSP surfaces may be employed as an alternative flex circuit in the present invention. For example, structures known as rigid-flex may be employed.

Form standard 34 is shown disposed adjacent to upper surface 20 of each of the CSPs below level four CSP 12. Form standard 34 may be fixed to upper surface 20 of the respective CSP with an adhesive 36 which preferably is thermally conductive. Form standard 34 may also, in alternative embodiments, merely lay on upper surface 20 or be separated from upper surface 20 by an air gap or medium such as a thermal slug or non-thermal layer.

Figure 7:
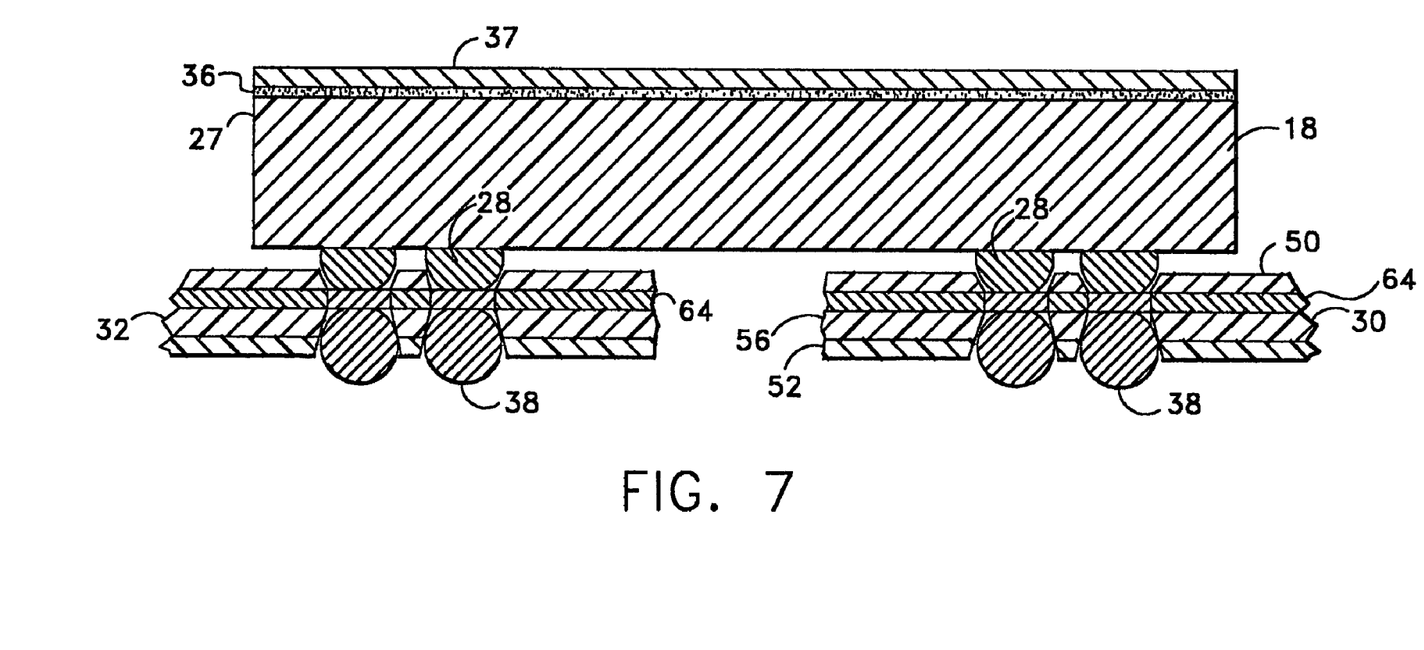
FIG. 7 is an elevation view of a portion of an alternative construction step in an alternative embodiment of the present invention.

In other embodiments, a heat spreader may act as a heat transference media and reside between the flex circuitry and the package body 27 or may be used in place of form standard 34. Such a heat spreader is shown in FIG. 7 as an example and is identified by reference numeral 37. In still other embodiments, there will be no heat spreader 37 or form standard 34 and the embodiment may use the flex circuitry as a heat transference material.

With continuing reference to FIG. 1, form standard 34 is, in a preferred embodiment, devised from copper to create, as shown in the depicted preferred embodiment of FIG. 1, a mandrel that mitigates thermal accumulation while providing a standard-sized form about which flex circuitry is disposed. Form standard 34 may take other shapes and forms such as, for example, an angular "cap" that rests upon the respective CSP body. Form standard 34 also need not be thermally enhancing although such attributes are preferable. The form standard 34 allows modules 10 to be devised with CSPs of varying sizes, while articulating a single set of connective structures useable with the varying sizes of CSPs. Thus, a single set of connective structures such as flex circuits 30 and 32 (or a single flexible circuit in the mode where a single flex is used in place of the flex circuit pair 30 and 32) may be devised and used with the form standard 34 method and/or systems disclosed herein to create stacked modules from CSPs having different sized packages. This will allow the same flexible circuitry set design to be employed to create iterations of a stacked module 10 from constituent CSPs having a first arbitrary dimension X across attribute Y (where Y may be, for example, package width), as well as modules 10 from constituent CSPs having a second arbitrary dimension X prime across that same attribute Y. Thus, CSPs of different sizes may be stacked into modules 10 with the same set of connective structures (i.e. flex circuitry). In a preferred embodiment, form standard 34 will present a lateral extent broader than the upper major surface of the CSP over which it is disposed. Thus, the CSPs from one manufacturer may be aggregated into a stacked module 10 with the same flex circuitry used to aggregate CSPs from another manufacturer into a different stacked module 10 despite the CSPs from the two different manufacturers having different dimensions.

Further, as those of skill will recognize, mixed sizes of CSPs may be implemented into the same module 10, such as would be useful to implement embodiments of a system-on-a-stack such as those disclosed in co-pending application U.S. patent application Ser. No. 10/136,890, filed May 2, 2002, which is hereby incorporated by reference and commonly owned by the assignee of the present application.

Preferably, portions of flex circuits 30 and 32 are fixed to form standard 34 by adhesive 35 which is preferably a tape adhesive, but may be a liquid adhesive or may be placed in discrete locations across the package. Preferably, adhesive 35 is thermally conductive.

In a preferred embodiment, flex circuits 30 and 32 are multi-layer flexible circuit structures that have at least two conductive layers examples of which are those described in U.S. application Ser. No. 10/005,581, now U.S. Pat. No. 6,576,992, which has been incorporated by reference herein. Other embodiments may, however, employ flex circuitry, either as one circuit or two flex circuits to connect a pair of CSPs, that have only a single conductive layer.

Preferably, the conductive layers employed in flex circuitry of module 10 are metal such as alloy 110. The use of plural conductive layers provides advantages and the creation of a distributed capacitance across module 10 intended to reduce noise or bounce effects that can, particularly at higher frequencies, degrade signal integrity, as those of skill in the art will recognize.

Module 10 of FIG. 1 has plural module contacts 38 collectively identified as module array 40. Connections between flex circuits are shown as being implemented with low profile inter-flex contacts 42 which are, in preferred embodiments, low profile contacts comprised of solder-combined with pads and/or rings such as the flex contacts 44 shown in FIG. 3 or flex contacts 44 with orifices as shown in FIG. 4 being just examples.

Form standard 34, as employed in one preferred embodiment, is approximately 5 mils in thickness, while flex circuits 30 and 32 are typically thinner than 5 mils. Thus, the depiction of FIG. 1 is not to scale.

Figure 4:
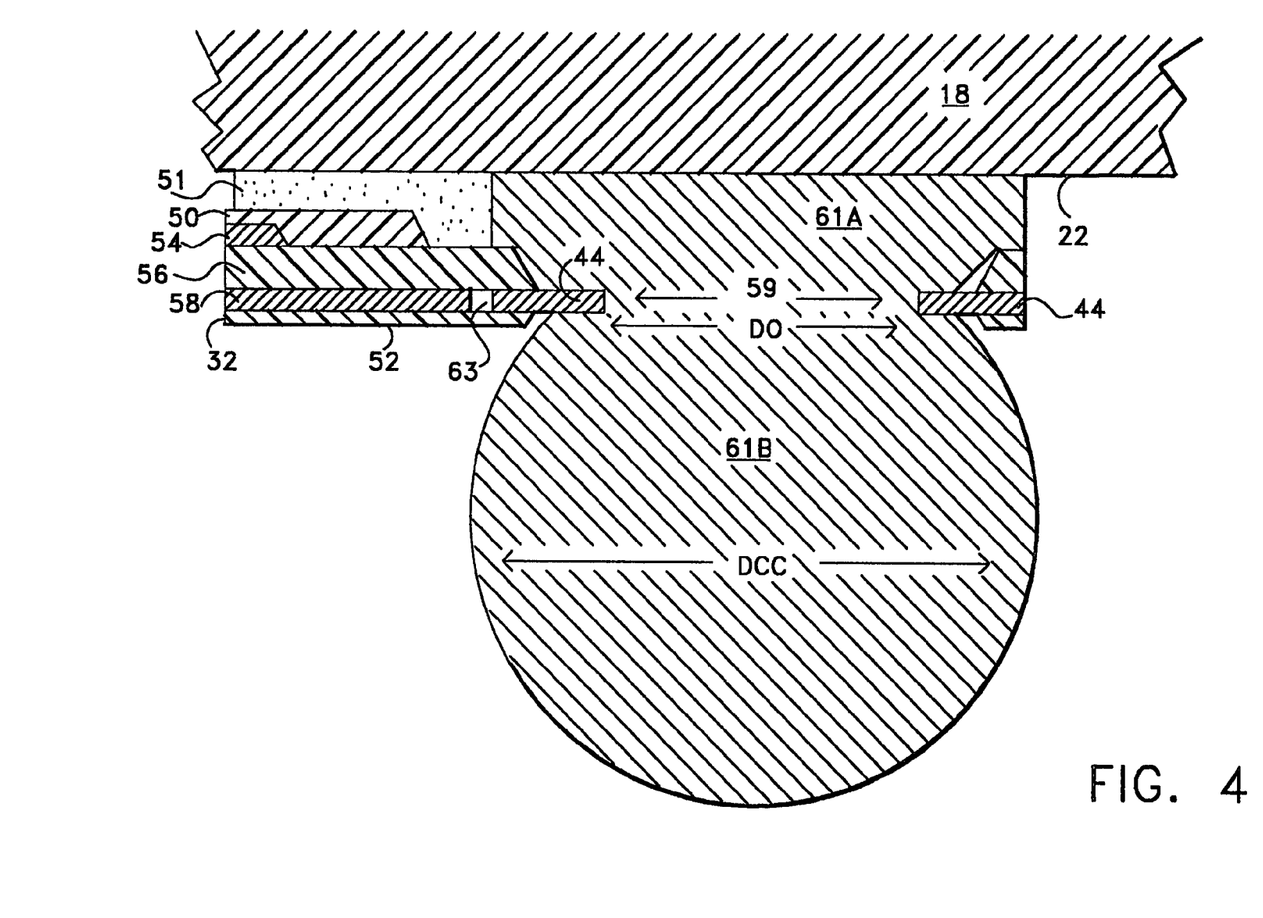
FIG. 4 depicts, in enlarged view, one alternative construction for of the area marked "A" in FIG. 2.
Figure 5:
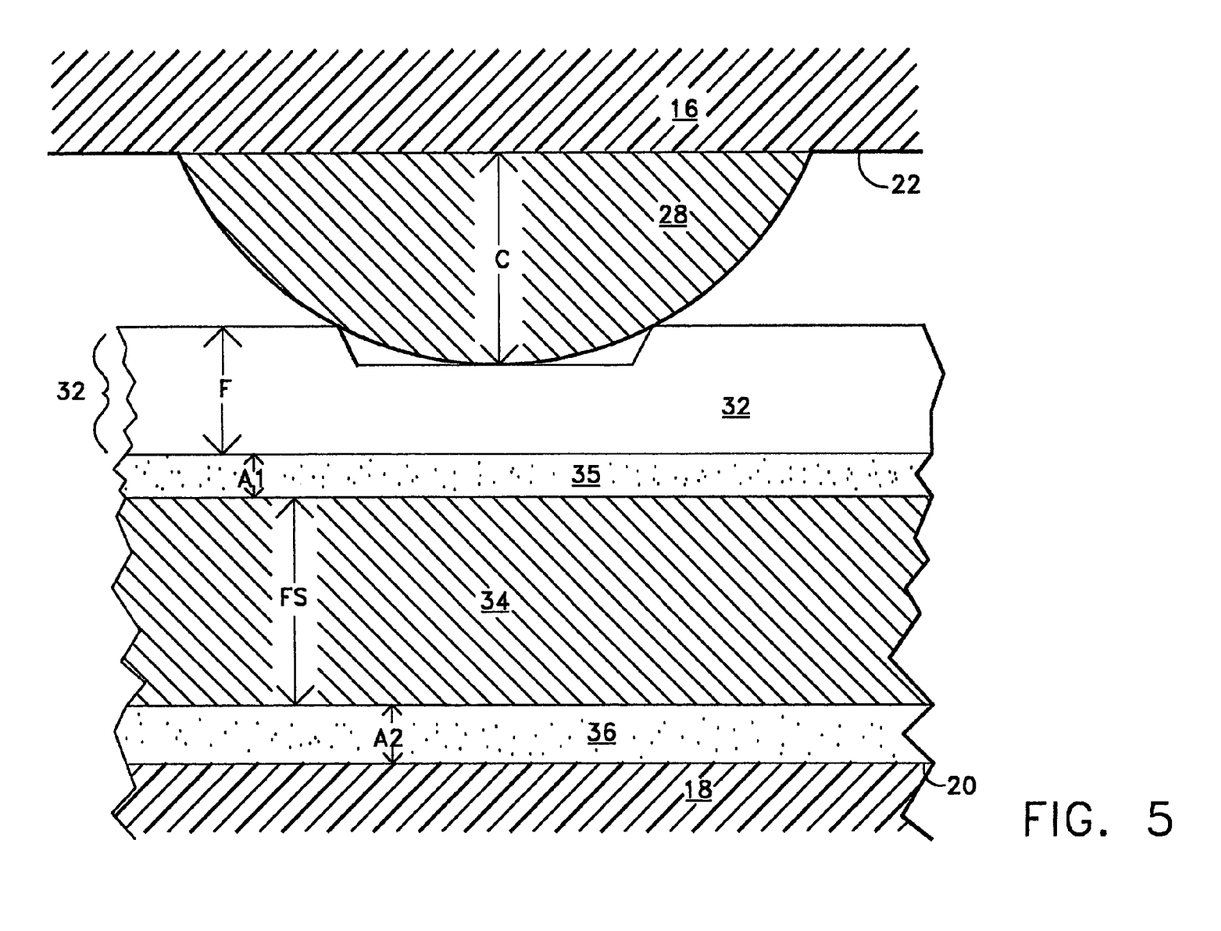
FIG. 5 depicts in enlarged view, the area marked "B" in FIG. 2 in a preferred embodiment of the present invention.

FIG. 2 illustrates an exemplar two-high module 10 devised in accordance with a preferred embodiment of the present invention. The depiction of FIG. 2 identifies two areas "A" and "B", respectively, that are shown in greater detail in later figures. In later FIGS. 3 and 4, there are shown details of two alternative embodiments for the area marked "A" in FIG. 2. It should be understood that many different connection alternatives are available and within the scope of the invention. FIG. 5 depicts details of the area marked "B" in FIG. 2.

Figure 3:
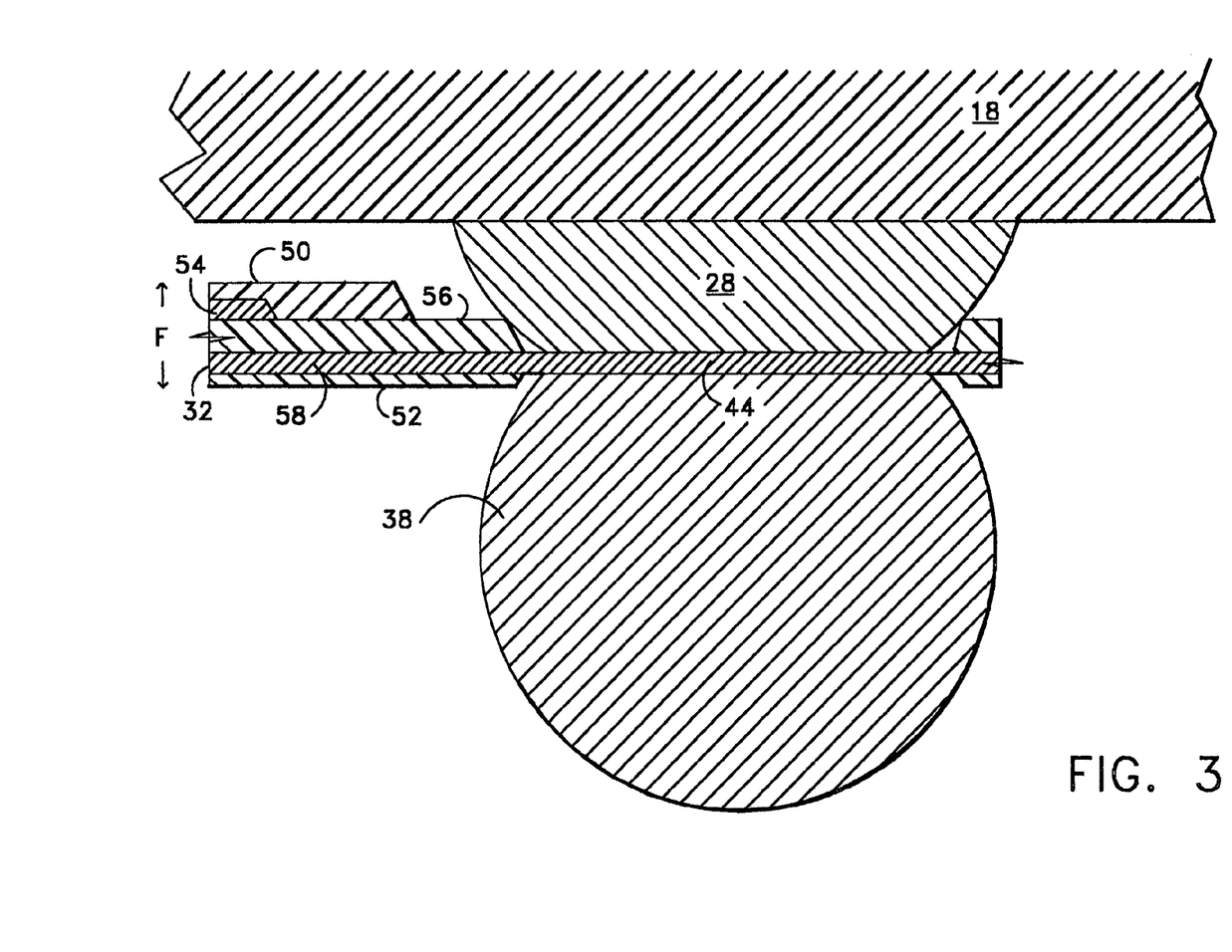
FIG. 3 depicts, in enlarged view, the area marked "A" in FIG. 2 in a preferred embodiment of the present invention.

FIG. 3 depicts, in enlarged view, one alternative for structures that may be used in the area marked "A" in FIG. 2. FIG. 3 depicts an example preferred connection between an example low profile contact 28 and module contact 38 through flex contact 44 of flex 32 to illustrate a solid metal path from level one CSP 18 to module contact 38 and, therefore, to an application PWB or memory expansion board to which module 10 is connectable.

Flex 32 is shown in FIG. 3 to be comprised of multiple conductive layers. This is merely an exemplar flexible circuitry that may be employed with the present invention. A single conductive layer and other variations on the flexible circuitry may, as those of skill will recognize, be employed to advantage in alternative embodiments of the present invention.

Flex 32 has a first outer surface 50 and a second outer surface 52. Preferred flex circuit 32 has at least two conductive layers interior to first and second outer surfaces 50 and 52. There may be more than two conductive layers in flex 30 and flex 32 and other types of flex circuitry may employ only one conductive layer. In the depicted preferred embodiment, first conductive layer 54 and second conductive layer 58 are interior to first and second outer surfaces 50 and 52. Intermediate layer 56 lies between first conductive layer 54 and second conductive layer 58. There may be more than one intermediate layer, but one intermediate layer of polyimide is preferred. The designation "F" as shown in FIG. 3 notes the thickness "F" of flex circuit 32 which, in preferred embodiment, is approximately 3 mils. Thinner flex circuits may be employed, particularly where only one conductive layer is employed, and flex circuits thicker than 3 mils may also be employed, with commensurate addition to the overall height of module 10.

As depicted in FIG. 3 and seen in more detail in Figs. found in U.S. application Ser. No. 10/005,581, now U.S. Pat. No. 6,576,992, which has been incorporated by reference, an example flex contact 44 is comprised from metal at the level of second conductive layer 58 interior to second outer surface 52.

FIG. 4 depicts an alternative structure for the connection in the area marked "A" in FIG. 2. In the depiction of FIG. 4, a flex contact 44 is penetrated by orifice 59 which has a median opening of dimension "DO" indicated by the arrow in FIG. 4. Demarcation gap 63 is shown in FIG. 4. This gap which is further described in incorporated U.S. patent application Ser. No. 10/005,581, now U.S. Pat. No. 6,576,992, may be employed to separate or demarcate flex contacts such as flex contact 44 from its respective conductive layer. Also shown in FIG. 4 is an optional adhesive or conformed material 51 between flex circuit 32 and CSP 18.

The consolidated contact 61 shown in FIG. 4 provides connection to CSP 18 and passes through orifice 59. Consolidated contact 61 may be understood to have two portions 61A that may be identified as an "inner" flex portion and, 61B that may be identified as an "outer" flex portion, the inner and outer flex portions of consolidated contact 61 being delineated by the orifice. The outer flex portion 61B of consolidated contact 61 has a median lateral extent identified in FIG. 4 as "DCC" which is greater than the median opening "DO" of orifice 59. The depicted consolidated contact 61 is preferably created in a preferred embodiment, by providing a CSP with ball contacts. Those ball contacts are placed adjacent to flex contacts 44 that have orifices 59. Heat sufficient to melt the ball contacts is applied. This causes the ball contacts to melt and reflow in part through the respective orifices 59 to create emergent from the orifices, outer flex portion 61B, leaving inner flex portion 61A nearer to lower surface 22 of CSP 18.

Thus, in the depicted embodiment, module 10 is constructed with a level one CSP 18 that exhibits balls as contacts, but those ball contacts are re-melted during the construction of module 10 to allow the solder constituting the ball to pass through orifice 59 of the respective flex contact 44 to create a consolidated contact 61 that serves to connect CSP 18 and flex circuitry 32, yet preserve a low profile aspect to module 10 while providing a contact for module 10. Those of skill will recognize that this alternative connection strategy may be employed with any one or more of the CSPs of module 10.

As those skilled will note, a consolidated contact 61 may be employed to take the place of a low profile contact 28 and module contact 38 in the alternative embodiments. Further, either alternatively, or in addition, a consolidated contact 61 may also be employed in the place of a low profile contact 28 and/or an inter-flex contact 42 in alternative embodiments where the conductive layer design of the flex circuitry will allow the penetration of the flex circuitry implicated by the strategy.

FIG. 5 depicts the area marked "B" in FIG. 2. The depiction of FIG. 5 includes approximations of certain dimensions of several elements in a preferred embodiment of module 10. It must be understood that these are just examples relevant to some preferred embodiments, and those of skill will immediately recognize that the invention may be implemented with variations on these dimensions and with and without all the elements shown in FIG. 5.

There are a variety of methods of creating low profile contacts 28. One method that is effective is the screen application of solder paste to the exposed CSP contact pad areas of the CSP and/or to the contact sites of the flex circuitry. For screened solder paste, the reflowed joint height of contact 28 will typically be between 0.002" and 0.006" (2 to 6 mils). The stencil design, the amount of solder remaining on 'ball-removed' CSPs, and flex planarity will be factors that could have a significant effect on this value. Low profile contact 28 has a height "C" which, in a preferred embodiment, is between 2 and 7 mils. Flex circuitry 32, with one or two or more conductive layers, has a thickness "F" of about 4 mils or less in a preferred embodiment. Adhesive layer 35 has a thickness "A1" of between 1 and 1.5 mils in a preferred embodiment. Form standard 34 has a thickness "FS" of between 4 and 6 mils in a preferred embodiment and, adhesive layer 36 has a thickness "A2" of between 1 and 2 mils. Thus, the total distance between lower surface 22 of CSP 16 and upper surface 20 of CSP 18 passing through one of low profile contacts 28 of CSP 16 is approximated by the formula:

$$(C+F+A1+FS+A2) - \text{distance low profile contact 28 penetrates into flex 32} \quad (1)$$

In practice, this should be approximately between 9 and 20 mils in a preferred embodiment. A similar calculation can be applied to identify the preferred distances between, for example, CSP 14 and CSP 16 in a four-high module 10. In such cases, the height of inter-flex contact 42 and thickness of another layer of flex circuit 32 will be added to the sum to result in a preferred range of between 13 and 31 mils. It should be noted that in some embodiments, not all of these elements will be present, and in others, added elements will be found. For example, some of the adhesives may be deleted, and form standard 34 may be replaced or added to with a heat spreader 37 and, in still other versions, neither a form standard 34 nor a heat spreader 37 will be found. As an example, where there is no use of a heat spreader 37 or form standard 34, the distance between lower surface 22 of CSP 16 and upper surface 20 of CSP 18 in a two-element module 10 will be preferably between 4.5 and 12.5 mils and more preferably less than 11 mils.

It is often desirable, but not required, to create low profile contacts 28 and low profile inter-flex contacts 42 using HT joints as described in co-pending application U.S. patent application Ser. No. 10/457,608 which is incorporated by reference herein and is commonly-owned by the assignee of the present invention.

Figure 6:
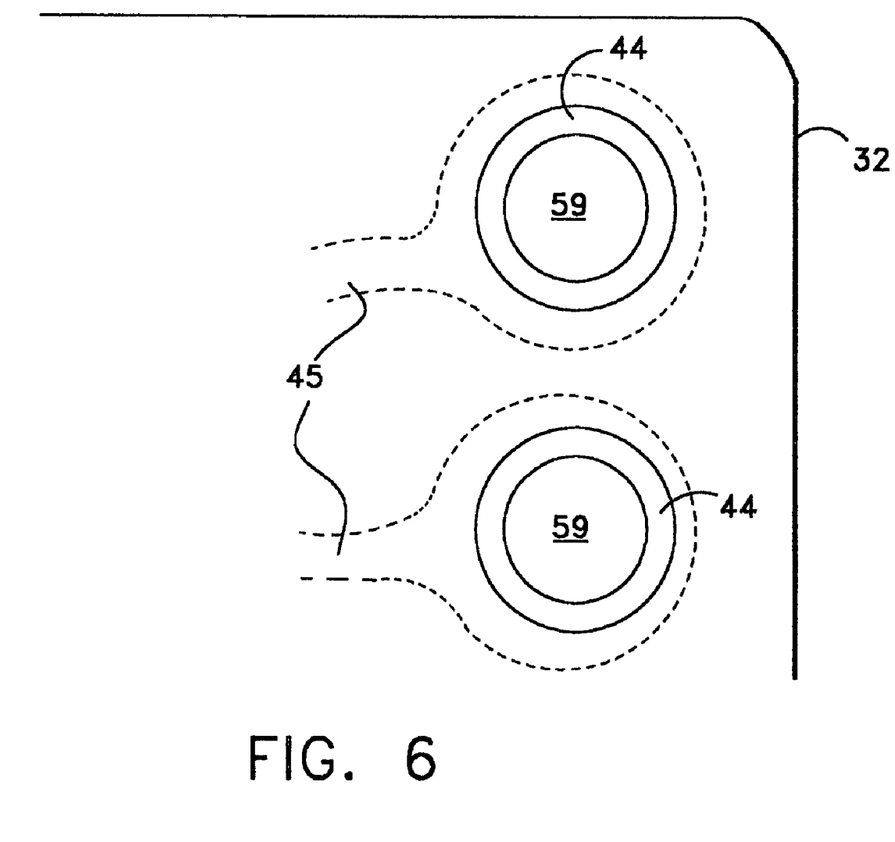
FIG. 6 depicts, in enlarged view, a portion of a flex circuitry employed with the structure of FIG. 4 in an alternative preferred embodiment of the present invention.

FIG. 6 depicts a plan view of a contact structure in flex 32 that may be employed to implement the consolidated contact 61 shown earlier in FIG. 4. Shown in FIG. 6 are two exemplar flex contacts 44 that each have an orifice 59. It may be considered that flex contacts 44 extend further than the part visible in this view as represented by the dotted lines that extend into traces 45. The part of flex contact 44 visible in this view is to be understood as being seen through windows in other layers of flex 32 as described in the incorporated by reference application U.S. patent application Ser. No. 10/005,581, now U.S. Pat. No. 6,576,992, depending upon whether the flex contact is articulated at a first conductive layer or, if it is present in flex 32, a second conductive layer and intermediate layer and whether the flex contact is for connection to the lower one of two CSPs or the upper one of two CSPs in a module 10.

FIG. 7 depicts a flexible circuit connective set of flex circuits 30 and 32 that has a single conductive layer 64. It should be understood with reference to FIG. 6, that flex circuits 30 and 32 extend laterally further than shown and have portions which are, in the construction of module 10, brought about and disposed above the present, heat spreader 37, a form standard 34 (not shown), and/or upper surface 20 of CSP 18. In this single conductive layer flex embodiment of module 10, there are shown first and second outer layers 50 and 52 and intermediate layer 56.

Heat spreader 37 is shown attached to the body 27 of first level CSP 18 through adhesive 36. In some embodiments, a heat spreader 37 or a form standard 34 may also be positioned to directly contact body 27 of the respective CSP.

Heat transference from module can be improved with use of a form standard 34 or a heat spreader 37 comprised of heat transference material such as a metal and preferably, copper or a copper compound or alloy, to provide a significant sink for thermal energy. Although the flex circuitry operates as a heat transference material, such thermal enhancement of module 10 particularly presents opportunities for improvement of thermal performance where larger numbers of CSPs are aggregated in a single stacked module 10.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:

1. A high-density circuit module comprising:
    a first flex circuit having first and second conductive layers between which conductive layers is an intermediate layer, the first and second conductive layers being interior to first and second outer layers of the first flex circuit, the second conductive layer having upper and lower flex contacts, the upper flex contacts being accessible through second CSP windows through the second outer layer and the lower flex contacts being accessible through first CSP windows through the first outer layer, the first conductive layer and the intermediate layer, the lower flex contacts being further accessible through module contact windows through the second outer layer;
    a second flex circuit having first and second conductive layers between which conductive layers is an intermediate layer, the first and second conductive layers being interior to first and second outer layers of the second flex circuit, the second conductive layer having upper and lower flex contacts, the upper flex contacts being accessible through second CSP windows through the second outer layer and the lower flex contacts being accessible through first CSP windows through the first outer layer and the first conductive layer and the intermediate layer, the lower flex contacts being further accessible through module contact windows through the second outer layer;

a first CSP having first and second lateral sides and upper and lower major surfaces with contacts along the lower major surface, the contacts of the first CSP extending no further than 7 mils above the lower major surface of the first CSP and being connected to the lower flex contacts of the first and second flex circuits;

a second CSP having first and second lateral sides and upper and lower major surfaces with contacts along the lower major surface, the contacts of the second CSP extending no further than 7 mils above the lower major surface of the second CSP and being connected to the upper flex contacts of the first and second flex circuits;

a form standard disposed above the upper major surface of the first CSP; and a set of module contacts connected to the lower flex contacts of the first and second flex circuits.

2. The high-density circuit module of claim 1 in which the second conductive layer comprises at least one demarked voltage plane and a voltage set of the upper flex contacts and a voltage set of the lower flex contacts connect voltage conductive contacts of the first and second CSPs to one of the at least one voltage planes.

3. A high-density circuit module comprising:
a first flex circuit having first and second flex contacts;
a second flex circuit having first and second flex contacts;
a first CSP having a lower surface rising above which lower surface by no more than 7 mils are contacts that are connected to the first flex contacts of each of the first and second flex circuits;
a second CSP having a lower surface rising above which lower surface by no more than 7 mils are contacts that are connected to the second flex contacts of each of the first and second flex circuits; and
a set of module contacts connected to the second flex contacts.

4. The high-density circuit module of claim 3 further comprising a heat spreader.

5. The high density circuit module of claim 4 further comprising a form standard.

6. A high-density circuit module comprising:
a first CSP having an upper surface and a lower surface and a body with a height H1 that is the shortest distance from the upper surface to the lower surface of the first CSP, and along the lower surface there are plural first CSP low profile contacts, each of which plural first CSP low profile contacts extends no more than 7 mils from the surface of the first CSP and is a HT joint;
a second CSP in stacked disposition with the first CSP, the second CSP having an upper surface and a lower surface and a body with a height H2 that is the shortest distance from the upper surface to the lower surface of the second CSP, and along the lower surface there are plural second CSP low profile contacts, each of which plural second CSP low profile contacts extends no more than 7 mils from the surface of the second CSP and is a HT joint;
a first flex circuitry that connects the first CSP and the second CSP, a portion of which flex circuitry is disposed between the first and second CSPs.

7. A high-density circuit module comprising:
a first CSP having an upper surface and a lower surface and a body with a height H1 that is the shortest distance from the upper surface to the lower surface of the first CSP, and along the lower surface there are plural first CSP low profile contacts, each of which plural first CSP low profile contacts extends no more than 7 mils from the surface of the first CSP and is a HT joint;
a second CSP in stacked disposition with the first CSP, the second CSP having an upper surface and a lower surface and a body with a height H2 that is the shortest distance from the upper surface to the lower surface of the second CSP, and along the lower surface there are plural second CSP low profile contacts, each of which plural second CSP low profile contacts extends no more than 7 mils from the surface of the second CSP and is a HT joint;
a first flex circuitry that connects the first CSP and the second CSP, a portion of which flex circuitry is disposed between the first and second CSPs; and
plural module contacts are disposed along the first flex circuitry.

8. A high-density circuit module comprising:
a first CSP having an upper surface and a lower surface and a body with a height H1 that is the shortest distance from the upper surface to the lower surface of the first CSP, and along the lower surface there are plural first CSP low profile contacts, each of which plural first CSP low profile contacts extends no more than 7 mils from the surface of the first CSP;
a second CSP in stacked disposition with the first CSP, the second CSP having an upper surface and a lower surface and a body with a height H2 that is the shortest distance from the upper surface to the lower surface of the second CSP, and along the lower surface there are plural second CSP low profile contacts, each of which plural second CSP low profile contacts extends no more than 7 mils from the surface of the second CSP; and
flex circuitry comprised of two flex circuits each of which has two conductive layers and which two flex circuits connect the first CSP and the second CSP, a portion of each of the two flex circuits being disposed between the first and second CSPs.

9. A high-density circuit module comprising:
a first CSP having an upper surface and a lower surface and a body with a height H1 that is the shortest distance from the upper surface to the lower surface of the first CSP, and along the lower surface there are plural first CSP low profile contacts, each of which plural first CSP low profile contacts extends no more than 7 mils from the surface of the first CSP;
a second CSP in stacked disposition with the first CSP, the second CSP having an upper surface and a lower surface and a body with a height H2 that is the shortest distance from the upper surface to the lower surface of the second CSP, and along the lower surface there are plural second CSP low profile contacts, each of which plural second CSP low profile contacts extends no more than 7 mils from the surface of the second CSP; and
flex circuitry comprised of two flex circuits each of which has one conductive layer and which two flex circuits connect the first CSP and the second CSP.

10. A high-density circuit module comprising:
a first CSP having an upper surface and a lower surface and a body with a height H1 that is the shortest distance from the upper surface to the lower surface of the first CSP, and along the lower surface there are plural first CSP low profile contacts, each of which plural first CSP low profile contacts extends no more than 7 mils from the surface of the first CSP;

a second CSP in stacked disposition with the first CSP, the second CSP having an upper surface and a lower surface and a body with a height H2 that is the shortest distance from the upper surface to the lower surface of the second CSP, and along the lower surface there are plural second CSP low profile contacts, each of which plural second CSP low profile contacts extends no more than 7 mils from the surface of the second CSP;

a first flex circuitry that connects the first CSP and the second CSP, a portion of which flex circuitry is disposed between the first and second CSPs; and a form standard disposed above the upper surface of the first CSP and in which the shortest distance from the lower surface of the second CSP to the upper surface of the first CSP that passes through one of the plural second CSP low profile contacts is no more than 17 mils.

11. The high-density circuit module of claim 10 in which the flex circuitry is comprised of two flex circuits each of which has one conductive layer.

12. A high-density circuit module comprising:

a first CSP having an upper surface and a lower surface and a body with a height H1 that is the shortest distance from the upper surface to the lower surface of the first CSP, and along the lower surface there are plural first CSP low profile contacts, each of which plural first CSP low profile contacts extends no more than 7 mils from the surface of the first CSP;

a second CSP in stacked disposition with the first CSP, the second CSP having an upper surface and a lower surface and a body with a height H2 that is the shortest distance from the upper surface to the lower surface of the second CSP, and along the lower surface there are plural second CSP low profile contacts, each of which plural second CSP low profile contacts extends no more than 7 mils from the surface of the second CSP;

a first form standard disposed above the upper surface of the first CSP;

two flex circuits that connect the first CSP and the second CSP, a portion of each of which two flex circuits being disposed between the first and second CSPs and each one of which two flex circuits has two conductive layers at least one of which conductive layers has plural flex contacts and in which module the shortest distance from the lower surface of the second CSP to the upper surface of the first CSP that passes through one of the plural second CSP contacts is no more than 17 mils.

13. The high-density circuit module of claim 12 in which the plural first CSP low profile contacts and the plural second CSP low profile contacts are HT joints, selected ones of which HT joints are in contact with ones of the plural flex contacts.

14. The high-density circuit module of claim 13 further comprising module contacts.

15. The high-density circuit module of claim 12 further comprising:

a third CSP having an upper surface and a lower surface and a body with a height H3 that is the shortest distance from the upper surface to the lower surface, and along the lower surface there are plural third CSP low profile contacts, each of which plural third CSP low profile contacts extends no more than 7 mils from the surface of the third CSP;

a fourth CSP in stacked disposition with the third CSP, the fourth CSP having an upper surface and a lower surface and a body with a height H4 that is the shortest distance from the upper surface to the lower surface, and along the lower surface there are plural fourth CSP low profile contacts, each of which plural fourth CSP low profile contacts extends no more than 7 mils from the surface of the fourth CSP, the third CSP being disposed above the second CSP and the fourth CSP being disposed above the third CSP; and a second flex circuitry connecting the second CSP and the third CSP, the second flex circuitry being comprised of two conductive layers at least one of which two conductive layers has plural flex contacts; and a third flex circuitry connecting the third CSP and the fourth CSP, the second flex circuitry being comprised of two conductive layers at least one of which two conductive layers has plural flex contacts; and second and third form standards respectively disposed above the second and third CSPs.

16. The high-density circuit module of claim 15 in which at least one of the flex contacts has an orifice.

17. The high-density circuit module of claim 15 in which the first, second, and third form standards are comprised of copper.

18. The high-density circuit module of claim 15 in which the shortest distance from the lower surface of the fourth CSP to the upper surface of the first CSP that passes through one of the plural fourth CSP low profile contacts is less than HEIGHT4 where HEIGHT4=65 mils+H1+H2+H3+H4.

19. A high-density circuit module comprising:

a first CSP having an upper surface and a lower surface and a body with a height H1 that is the shortest distance from the upper surface to the lower surface of the first CSP, and along the lower surface there are plural first CSP low profile contacts, each of which plural first CSP low profile contacts extends no more than 7 mils from the surface of the first CSP;

a second CSP in stacked disposition with the first CSP, the second CSP having an upper surface and a lower surface and a body with a height H2 that is the shortest distance from the upper surface to the lower surface of the second CSP, and along the lower surface there are plural second CSP low profile contacts, each of which plural second CSP low profile contacts extends no more than 7 mils from the surface of the second CSP;

a first flex circuitry that connects the first CSP and the second CSP, a portion of which flex circuitry is disposed between the first and second CSPs;

a third CSP having an upper surface and a lower surface and a body with a height H3 that is the shortest distance from the upper surface to the lower surface, and along the lower surface there are plural third CSP low profile contacts, each of which plural third CSP low profile contacts extends no more than 7 mils from the surface of the third CSP;

a fourth CSP in stacked disposition with the third CSP, the fourth CSP having an upper surface and a lower surface and a body with a height H4 that is the shortest distance from the upper surface to the lower surface, and along the lower surface there are plural fourth CSP low profile contacts, each of which plural fourth CSP low profile contacts extends no more than 7 mils from the surface of the fourth CSP, the third CSP being disposed above the second CSP and the fourth CSP being disposed above the third CSP; and a second flex circuitry connecting the second CSP and the third CSP; and a third flex circuitry connecting the third CSP and the fourth CSP.

20. The high-density circuit module of claim 19 in which the first CSP is disposed beneath the second CSP and the shortest distance from the upper surface of the fourth CSP to the lower surface of the first CSP that passes through at least one of the plural fourth CSP low profile contacts is less than HEIGHT where HEIGHT=45 mils+H1+H2+H3+H4.

21. The high-density circuit module of claim 19 further comprising first, second, and third form standards each respectively disposed above the upper surface of the first, second, and third CSPs.

22. The high-density circuit module of claim 21 in which the shortest distance from the upper surface of the fourth CSP low profile contacts is less than HEIGHTFS where HEIGHTFS=65 mils=H1+H2+H3+H4.

23. A method of devising a high-density circuit module comprising the steps of:

provỉding a first CSP having contact sites along a major surface;

providing a second CSP having contact sites along a major surface;

providing flex circuitry that has two conductive layers and has plural flex contacts;

disposing solder to connect selected contact sites of the second CSP to a second set of the plural flex contacts so that the shortest distance from the major surface of the second CSP to a surface of the flex circuitry is between 1 and 6 mils inclusive.

24. The method of claim 23 in which the flex circuitry is comprised of two flex circuits.

25. A method of devising a high-density circuit module comprising the steps of:

providing a first CSP having a plurality of ball contacts disposed along a major surface;

providing a flex circuitry comprised of two flex circuits having a plurality of selected flex contacts each penetrated by an orifice;

disposing the first CSP proximal to the flex circuitry to place the plurality of ball contacts adjacent to the plurality of flex contacts;

applying heat sufficient to melt the plurality of ball contacts to pass through the respective orifices to form consolidated contacts each with an inner flex portion and an outer flex portion.

* * * * *